United States Patent
Son et al.

(10) Patent No.: US 8,772,115 B2
(45) Date of Patent: Jul. 8, 2014

(54) SEMICONDUCTOR DEVICE HAVING SELECTIVELY NITRIDED GATE INSULATING LAYER AND METHOD OF FABRICATING THE SAME

(71) Applicant: Samsung Electronics Co., Ltd., Suwon-si (KR)

(72) Inventors: HyeokJun Son, Seoul (KR); Sangjin Hyun, Suwon-si (KR); Sangbom Kang, Seoul (KR); SungKee Han, Seoul (KR); Sughun Hong, Yongin-si (KR); Hyung-seok Hong, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/770,709

(22) Filed: Feb. 19, 2013

(65) Prior Publication Data

US 2013/0316525 A1    Nov. 28, 2013

(30) Foreign Application Priority Data

May 24, 2012   (KR) ......................... 10-2012-0055441

(51) Int. Cl.
*H01L 21/8238* (2006.01)

(52) U.S. Cl.
USPC ..... 438/275; 438/216; 438/591; 257/E21.635

(58) Field of Classification Search
CPC ...................... H01L 29/518; H01L 21/280202
USPC ........... 438/216, 275, 287, 591; 257/E21.625
See application file for complete search history.

(56) References Cited

U.S. PATENT DOCUMENTS

| | | | |
|---|---|---|---|
| 7,056,836 B2 | 6/2006 | Watanabe | |
| 7,429,540 B2 | 9/2008 | Olsen | |
| 7,563,726 B2 | 7/2009 | Cho et al. | |
| 2004/0058558 A1 | 3/2004 | Sakurai | |
| 2008/0200000 A1* | 8/2008 | Minakata | ...................... 438/303 |
| 2011/0169097 A1 | 7/2011 | Wang et al. | |
| 2011/0227163 A1 | 9/2011 | Wang et al. | |

FOREIGN PATENT DOCUMENTS

| | | |
|---|---|---|
| JP | 2004047699 | 2/2004 |
| JP | 2006313769 | 11/2006 |
| KR | 1020030043250 | 6/2003 |
| KR | 1020040044207 | 5/2004 |
| KR | 1020070040576 | 4/2007 |

* cited by examiner

*Primary Examiner* — Thanhha Pham
(74) *Attorney, Agent, or Firm* — Onello & Mello, LLP (57) ABSTRACT

A semiconductor device including a selectively nitrided gate insulating layer may be fabricated by a method that includes forming a first gate insulating layer on a substrate having a first region and a second region, performing a nitridation process on the first gate insulating layer, removing the first gate insulating layer from at least a portion of the first region to expose at least a portion of the substrate, forming a second gate insulating layer on at least the exposed portion of the first region of the substrate, thermally treating the first and second gate insulating layers in an oxygen atmosphere, forming a high-k dielectric on the first and second gate insulating layers, and forming a metal gate electrode on the high-k dielectric.

16 Claims, 8 Drawing Sheets

SEMICONDUCTOR DEVICE HAVING SELECTIVELY NITRIDED GATE INSULATING LAYER AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0055441, filed on May 24, 2012, in the Korean Intellectual Property Office, the entire contents of which are hereby incorporated by reference.

BACKGROUND OF THE INVENTION

Embodiments of the inventive concept relate to a semiconductor device having a selectively nitrided gate insulating layer and to a method of fabricating the selectively nitrided gate insulating layer.

A semiconductor device may include a gate insulating layer and a gate electrode, which may be formed on a substrate with n-channel metal oxide semiconductor (NMOS) and p-channel metal oxide semiconductor (PMOS) regions. Transistors provided on the NMOS region may be configured to have different properties from those on the PMOS region.

SUMMARY

Example embodiments of the inventive concept provide a method capable of improving the quality of the gate insulating layers of NMOS and PMOS transistors.

Example embodiments of the inventive concept provide a method capable of improving a time-dependent dielectric breakdown (TDDB) property of the gate insulating layer of the NMOS transistor and a negative bias temperature instability (NBTI) property of the gate insulating layer of the PMOS transistor (i.e., reducing TDDB and NBTI).

Example embodiments of the inventive concept provide a semiconductor device with improved reliability.

According to example embodiments of the inventive concept, a method of fabricating a semiconductor device may include forming a first gate insulating layer on a substrate having a first region and a second region, performing a nitridation process on the first gate insulating layer, removing the first gate insulating layer from at least a portion of the first region to expose at least a portion of the substrate, forming a second gate insulating layer on at least the exposed portion of the first region of the substrate, thermally treating the first and second gate insulating layers in an oxygen atmosphere, forming a high-k dielectric on the first and second gate insulating layers, and forming a metal gate electrode on the high-k dielectric.

In example embodiments, the method may further include thermally treating the first gate insulating layer in an oxygen atmosphere after performing the nitridation process and before removing the first gate insulating layer from the first region.

In example embodiments, the method may further include forming a hydroxyl group on the first and second gate insulating layers before forming the high-k dielectric.

In example embodiments, the method may further include forming an interlayered insulating layer having a first trench and a second trench on the substrate, before forming the first gate insulating layer, wherein forming the interlayered insulating layer includes forming a first dummy gate pattern on the first region of the substrate, forming a second dummy gate pattern on the second region of the substrate, forming the interlayered insulating layer to expose top surfaces of the first and second dummy gate patterns, and removing the first and second dummy gate patterns to expose the substrate.

In example embodiments, the method may further include forming spacers on sidewalls of the first and second dummy gate patterns.

In example embodiments, the first and second gate insulating layers may be formed on bottom surfaces of the first and second trenches, respectively.

In example embodiments, the first region may be a PMOS region and the second region may be an NMOS region.

In example embodiments, the first gate insulating layer may have a thickness that is greater than that of the second gate insulating layer.

In example embodiments, forming the first gate insulating layer may be achieved by at least one process selected from thermal oxidation, radical oxidation, rapid thermal oxidation, ultra-violet oxidation, oxidation using a solution containing oxygenated water and ammonium hydroxide, and ozone oxidation.

In example embodiments, the nitridation of the first gate insulating layer may be achieved using at least one process selected from plasma nitridation and rapid thermal nitridation.

In example embodiments, removing the first gate insulating layer from the first region may be performed using hydrogen fluoride.

In example embodiments, forming the second gate insulating layer may be achieved by at least one process selected from rapid thermal oxidation, ultra-violet oxidation, oxidation using a solution containing oxygenated water and ammonium hydroxide, and ozone oxidation.

In example embodiments, the thermal treatment of the first and second gate insulating layers in the oxygen atmosphere is performed by at least one process selected from rapid thermal annealing, spike-rapid thermal annealing, flash-rapid thermal annealing, and low-pressure annealing.

In example embodiments, the high-k dielectric comprises at least one composition selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In example embodiments, the metal gate electrode comprises at least one composition selected from titanium (Ti), titanium nitride (TiN), tantalum (Ta), tantalum nitride (TaN), tungsten (W), copper (Cu), aluminum (Al), and mixtures thereof.

In example embodiments, a method of fabricating a semiconductor device may include injecting nitrogen into a first gate insulating layer on a substrate having a first region and a second region via a nitridation process; forming a second gate insulating layer on a portion of the first region of the substrate that is exposed and not covered by the first gate insulating layer; thermally treating the first and second gate insulating layers in an oxygen atmosphere, wherein the thermal treatment moves nitrogen further away from an interface between the substrate and the first gate insulating layer; forming a high-k dielectric on the first and second gate insulating layers; and forming a metal gate electrode on the high-k dielectric.

According to example embodiments of the inventive concept, a semiconductor device may include an interlayered insulating layer formed on a substrate having a first region and a second region and including first and second trenches exposing the substrate at the first and second regions, respectively; a first gate insulating layer is provided in the first trench to cover the substrate; a second gate insulating layer is provided in the second trench to cover the substrate and has a higher content of nitrogen atoms compared with that of the first gate insulating layer; a high-k dielectric provided on the first and second gate insulating layers; and metal gate electrodes are provided on the high-k dielectric to fill the first and second trenches. The nitrogen atom content of the second gate insulating layer may be less at an interface with the substrate than at an interface with the high-k dielectric.

BRIEF DESCRIPTION OF THE DRAWINGS

Example embodiments will be more clearly understood from the following brief description taken in conjunction with the accompanying drawings. FIGS. 1 through 14 represent non-limiting, example embodiments, as described herein.

FIGS. 14 and 15 schematically illustrate relocation of nitrogen atoms, which may occur in a first gate insulating layer during a thermal treatment in an oxygen atmosphere according to example embodiments of the inventive concept.

It should be noted that these figures are intended to illustrate the general characteristics of methods, structure and/or materials utilized in certain example embodiments and to supplement the written description provided below. These drawings, however, are not to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe the relationship of one element or feature to another/other element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms, "a," "an" and "the," are intended to include the plural forms as well, unless the context clearly indicates otherwise. It will be further understood that the terms, "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may not illustrate the actual shape of a region of a device and are not intended to limit the scope of example embodiments.

Unless otherwise defined, all terms (including technical and scientific terms) used herein have the same meaning as that which is commonly understood by one of ordinary skill in the art to which example embodiments of the inventive concept belong. It will be further understood that terms, such as those defined in commonly used dictionaries, should be interpreted as having a meaning that is consistent with their meaning in the context of the relevant art and are not to be interpreted in an idealized or overly formal sense unless expressly so defined herein.

Methods of fabricating a semiconductor device according to example embodiments of the inventive concept will be described with reference to FIGS. 1 through 13. FIGS. 1 through 13 are sectional views illustrating methods of fabricating a semiconductor device according to example embodiments of the inventive concept. In order to reduce complexity in the drawings and to provide a better understanding of example embodiments of the inventive concept, some elements (e.g., source/drain regions and metal wires) of the semiconductor device may be omitted.

Figure 1:
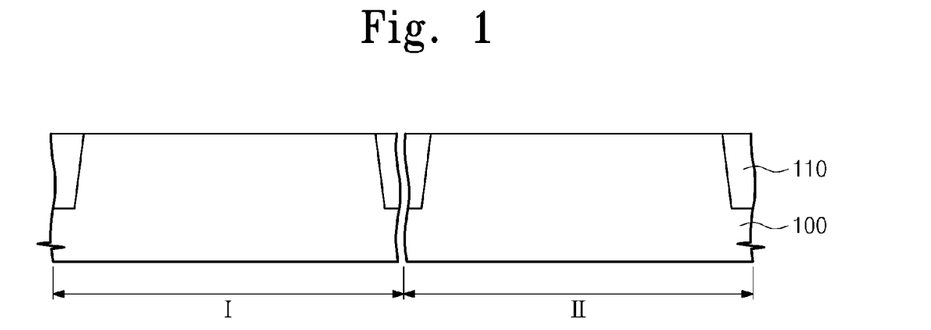
FIGS. 1 through 13 are sectional views illustrating methods of fabricating a semiconductor device according to example embodiments of the inventive concept.

Referring to FIG. 1, a substrate 100 may be provided. The substrate 100 may be a silicon substrate, for example, a bulk silicon wafer or a silicon-on-insulator (SOI) substrate. The substrate 100 may include material(s) other than silicon; for example, the substrate 100 may also include at least one of germanium, indium antimonide, lead-tellurium compound, indium arsenic, indium phosphide, gallium arsenic, or gallium antimonide. The substrate 100 may be divided into a first region I and a second region II. For example, the first region I may be a region provided with PMOS transistors, and the second region II may be a region provided with NMOS transistors.

A device isolation layer 110 may be formed at boundaries of the first and second regions I and II of the substrate and in the first and second regions I and II. The device isolation layer 110 may be formed by, for example, a shallow-trench-isolation (STI) process. The device isolation layer 110 may be formed of a silicon oxide. For example, the device isolation layer 110 may be formed of at least one of an undoped silicate glass (USG) layer, a boron doped silicate glass (BSG) layer, a phosphorous silicate glass (PSG) layer, a boro-phosphorous silicate glass (BPSG) layer, a spin-on-glass (SOG) oxide layer, or a high density plasma (HDP) oxide layer.

Figure 2:
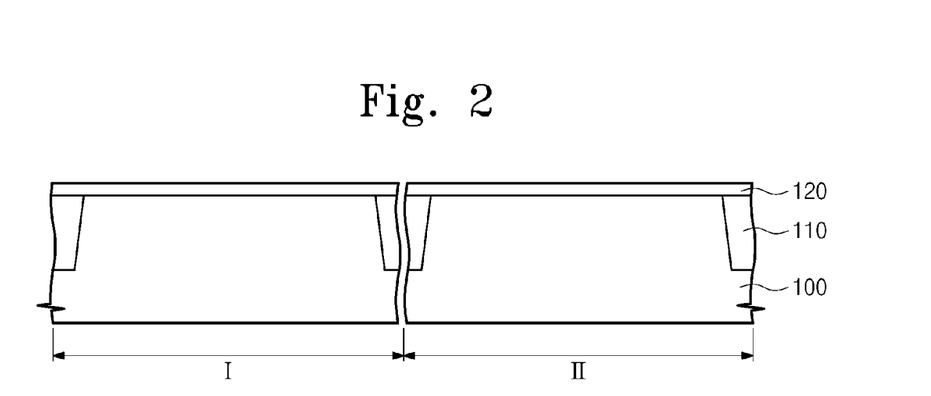

Referring to FIG. 2, a sacrificial insulating layer 120 may be formed on the substrate 100, may be formed of a silicon oxide layer or a silicon oxynitride layer, and may be formed by a thermal-oxidation process or by a chemical-vapor-deposition process.

Figure 3:
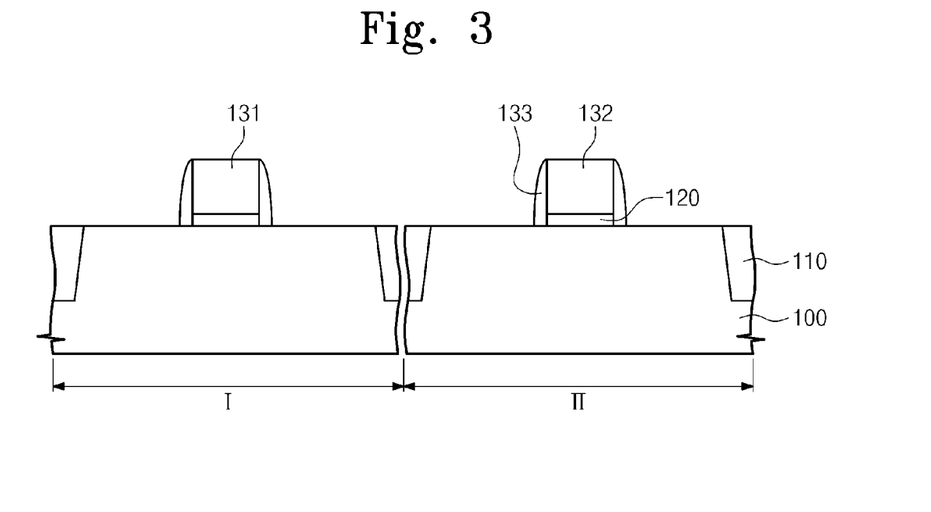

Referring to FIG. 3, first and second dummy gate patterns 131 and 132 may be formed on the sacrificial insulating layer 120 of the first and second regions I and II, respectively. The first and second dummy gate patterns 131 and 132 may be formed of a semiconductor material (e.g., polysilicon), though example embodiments of the inventive concept may not be limited thereto.

Spacers 133 may be formed on sidewalls of the first and second dummy gate patterns 131 and 132, respectively. The spacers 133 may be formed of a silicon nitride layer or a silicon oxynitride layer, though example embodiments of the inventive concept may not be limited thereto. In other embodiments, the formation of the spacers 133 may be omitted in consideration of convenience in the fabrication process.

Figure 4:
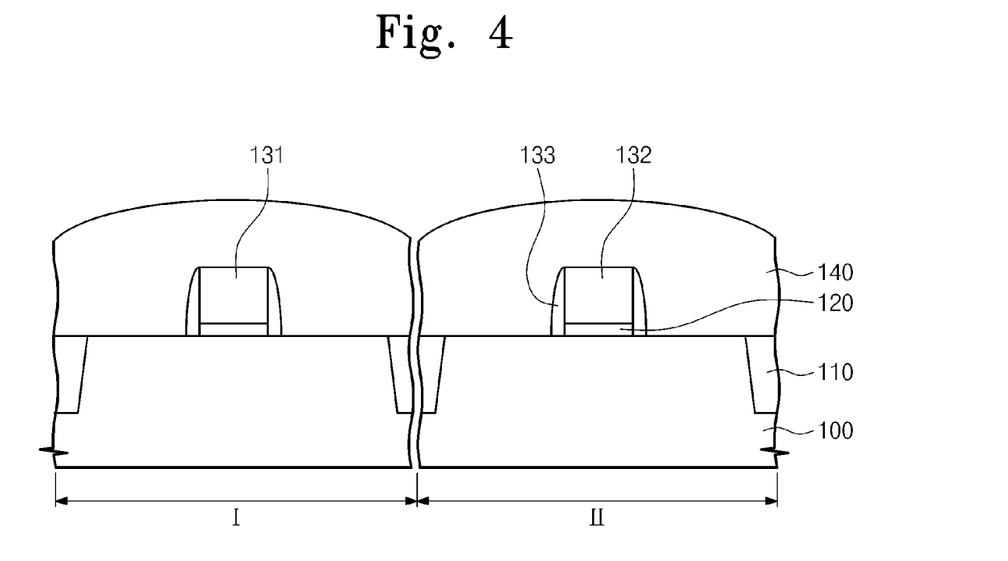

Referring to FIG. 4, an interlayered insulating layer 140 may be formed to cover the first and second dummy gate patterns 131 and 132. The interlayered insulating layer 140 may be formed of a silicon oxide layer, which may be formed by a high-density-plasma (HDP) process or by a flowable-chemical-vapor-deposition (FCVD) process.

Figure 5:
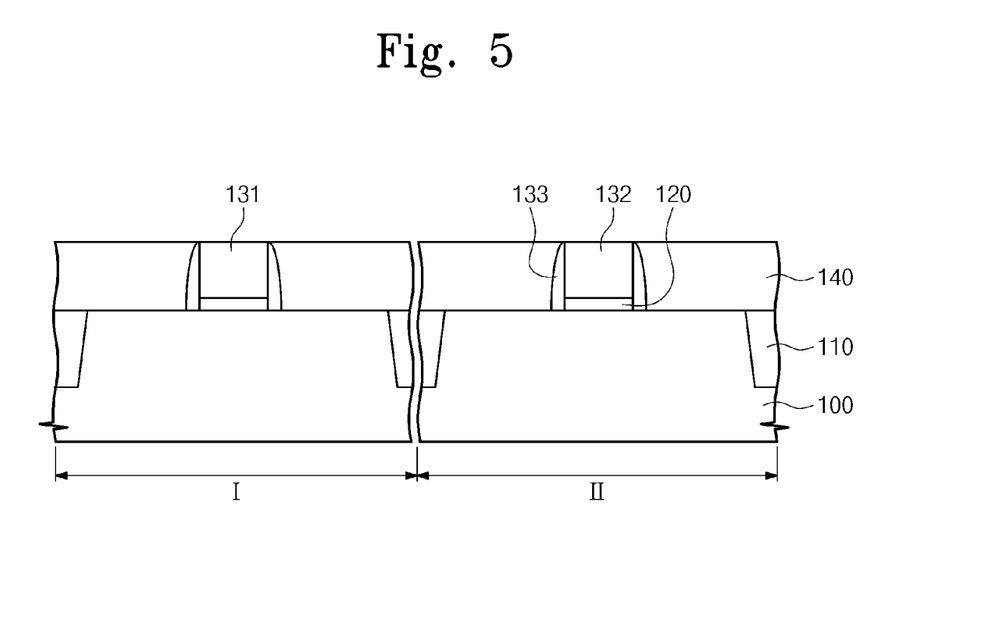

Referring to FIG. 5, a planarization process may be performed on the interlayered insulating layer 140, thereby exposing top surfaces of the first and second dummy gate patterns 131 and 132. The planarization of the interlayered insulating layer 140 may be performed using an etch-back process or by a chemical-mechanical-polishing (CMP) process.

Figure 6:
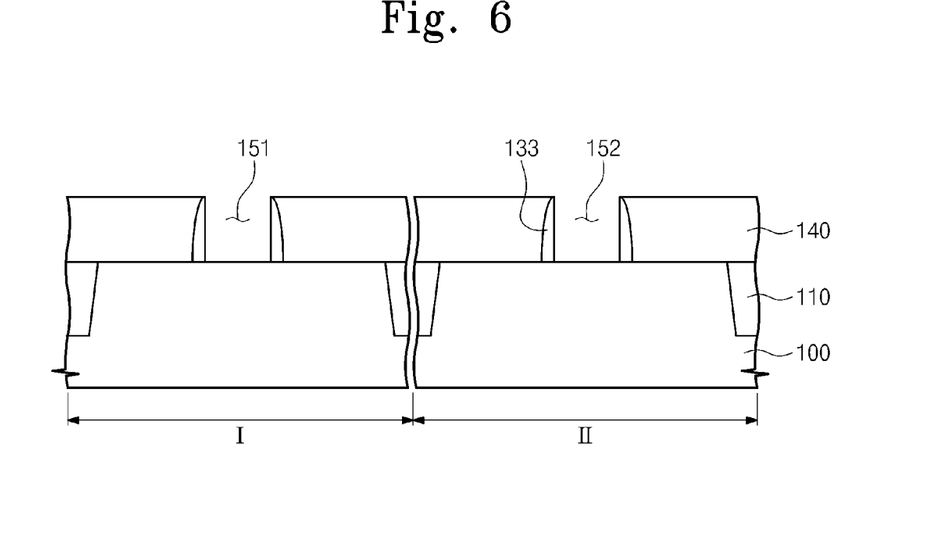

Referring to FIG. 6, first and second trenches 151 and 152 may be formed in the interlayered insulating layer 140 of the first and second regions I and II, respectively. For example, the formation of the first and second trenches 151 and 152 may include removing the first and second dummy gate patterns 131 and 132 and the sacrificial insulating layer 120 thereunder to expose the substrate 100. The first and second trenches 151 and 152 may have sidewalls delimited by the spacers 133.

Figure 7:
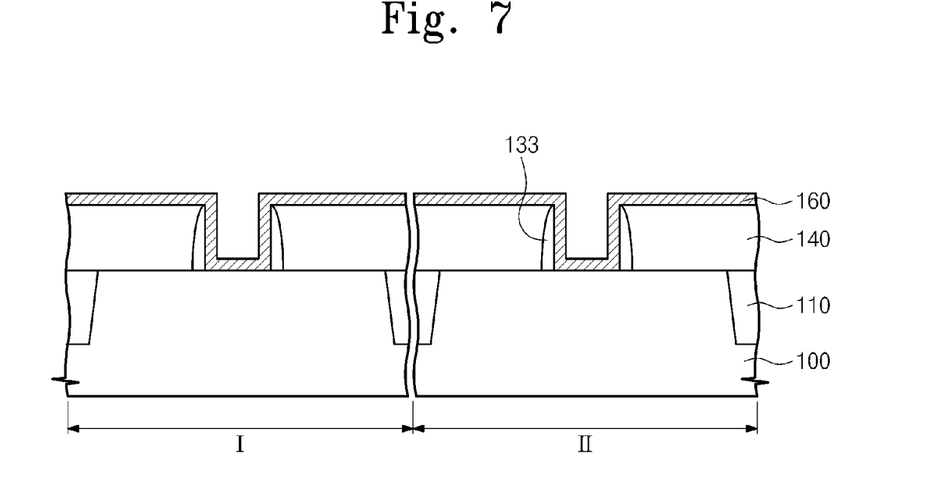

Referring to FIG. 7, a first gate insulating layer 160 may be formed to cover a top surface of the interlayered insulating layer 140, side and bottom surfaces of the first trench 151, and side and bottom surfaces of the second trench 152. The first gate insulating layer 160 may be formed of a silicon oxide layer. In other example embodiments, depending on the forming method, the first gate insulating layer 160 may be locally formed on the bottom surfaces of the first and second trenches 151 and 152.

The first gate insulating layer 160 may be formed by at least one process selected from thermal oxidation, radical oxidation, rapid thermal oxidation (RTO), ultra-violet (UV) oxidation, oxidation using a solution containing oxygenated water and ammonium hydroxide, and ozone oxidation.

After the formation of the first gate insulating layer 160, a nitridation process may be performed on the first gate insulating layer 160. The nitridation process may be performed using at least one process selected from plasma nitridation and rapid thermal nitridation (RTN). As the result of the nitridation process, a chemical composition of the first gate insulating layer 160 may be changed from silicon oxide to silicon oxynitride. The change in the chemical composition may occur across the entire or at a partial portion of the first gate insulating layer 160.

After the nitridation process, the first gate insulating layer 160 may further be thermally treated in an oxygen atmosphere. The thermal treatment in the oxygen atmosphere may be performed at a temperature of about 400° C. to about 1200° C.

Figure 8:
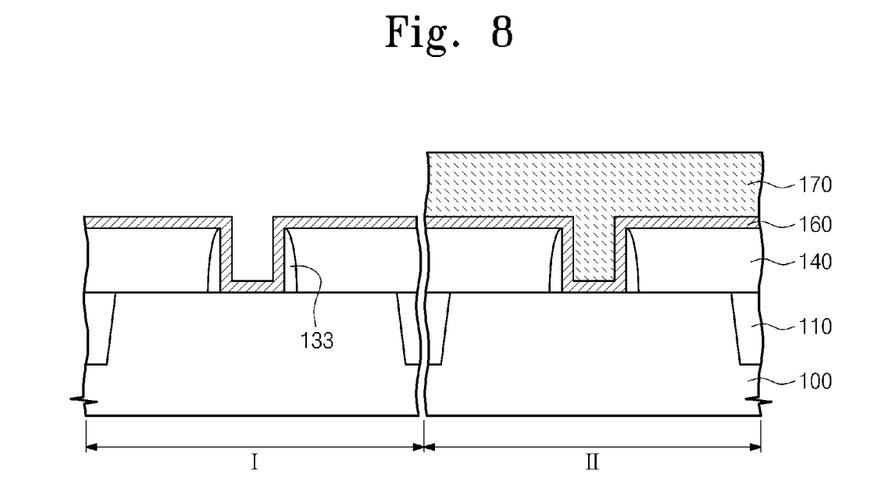

Referring to FIG. 8, a mask pattern 170 may be formed to cover the second trench 152 of the second region II. The mask pattern 170 may be formed of a photoresist material, though example embodiments of the inventive concept need not to be limited thereto. A portion of the mask pattern 170 may extend to the first region I. Alternatively, the mask pattern 170 may be locally formed to cover the second trench 152 of the second region II. In other words, the size of the mask pattern 170 may be changed, particularly if there is no problem in removing the first gate insulating layer 160 from the bottom surface of the first trench 151.

Figure 9:
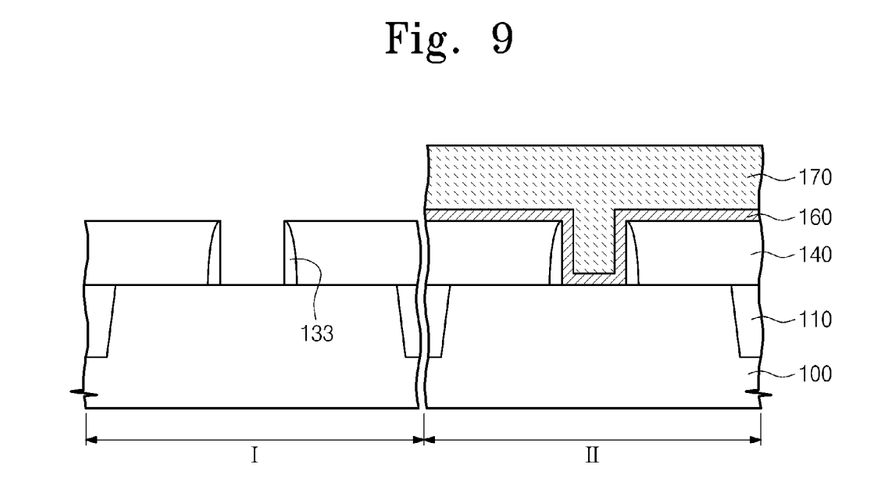

Referring to FIG. 9, the first gate insulating layer 160 may be removed from the bottom surface of the first trench 151. The removal of the first gate insulating layer 160 may be performed using an etching solution or an etching gas containing hydrogen fluoride (HF). As the result of the removal of the first gate insulating layer 160 from the first trench 151, the substrate 100 may be exposed through the first trench 151.

Figure 10:
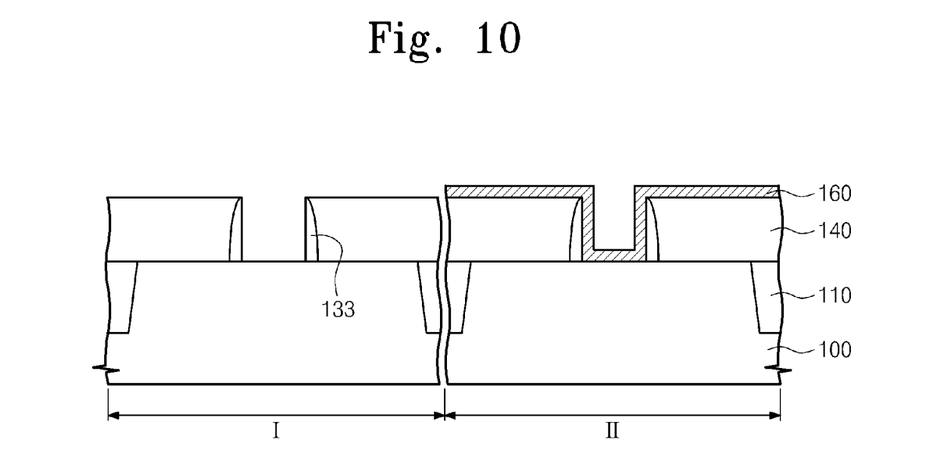

Referring to FIG. 10, the mask pattern 170 may be removed. The removal of the mask pattern 170 may be performed using a sulfuric acid ($H_2SO_4$) stripper, a high temperature mixture of sulfuric acid ($H_2SO_4$) and hydrogen peroxide ($H_2O_2$), or an organic stripper.

Figure 11:
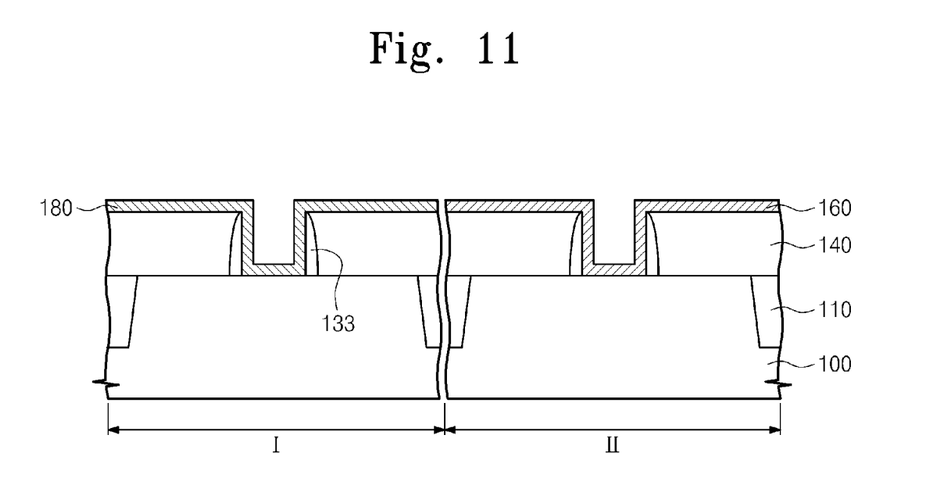

Referring to FIG. 11, a second gate insulating layer 180 may be formed on the bottom surface of the first trench 151. Here, the second gate insulating layer 180 may be formed to cover a sidewall of the first trench 151 and a top surface of the interlayered insulating layer 140.

The formation of the second gate insulating layer 180 may be performed using at least one process selected from rapid thermal oxidation (RTO), ultra-violet (UV) oxidation, oxidation using a solution containing oxygenated water and ammonium hydroxide, and ozone oxidation. The second gate insulating layer 180 may be formed to be thinner than the first gate insulating layer 160.

After formation of the second gate insulating layer 180, the first and second gate insulating layers 160 and 180 may be thermally treated in an oxygen atmosphere. The thermal treatment in the oxygen atmosphere may be performed using at least one process selected from rapid thermal annealing (RTA), spike-rapid thermal annealing (sRTA), flash-rapid thermal annealing (fRTA), and low-pressure annealing (LPA). The thermal treatment may be performed at a temperature of about 400° C. to about 1200° C.

Figure 14:
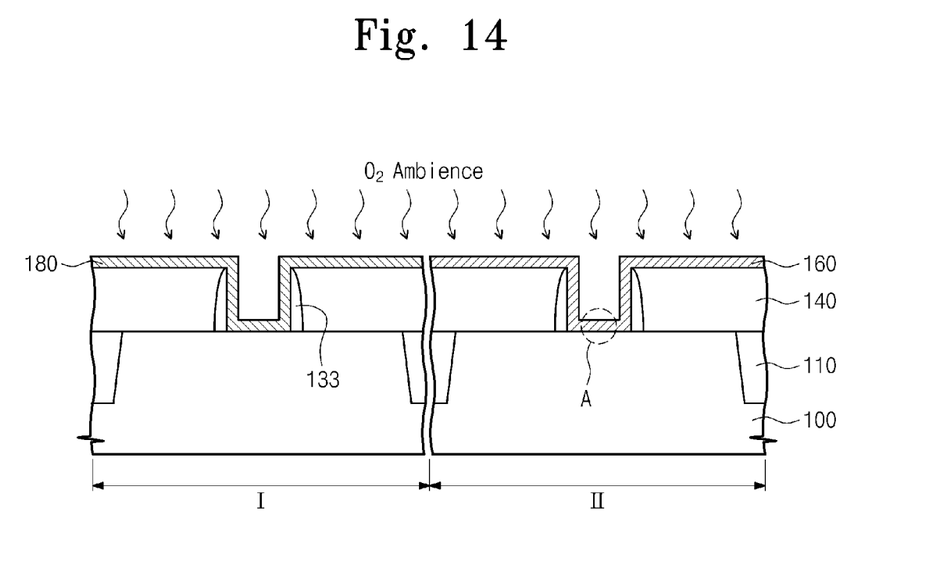
FIG. 14 is a sectional view.
Figure 15:
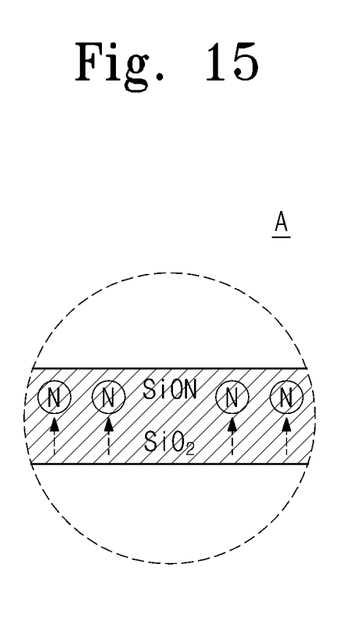
FIG. 15 is an enlarged view of a portion A of FIG. 14.

As the result of thermal treatment in the oxygen atmosphere, the second gate insulating layer 180 on PMOS transistor region I may have a reduced trap density. In example embodiments, nitrogen atoms injected into the first gate insulating layer 160 of the NMOS transistor region II may be moved further away from an interface between the substrate 100 and the first gate insulating layer 160, and this enables improvement regarding the deterioration in electron mobility. In more detail, referring to FIG. 14 and FIG. 15, thermal treatment in the oxygen atmosphere may result in a reaction of oxygen atoms with silicon atoms in a surface of the substrate 100, thereby forming a silicon oxide layer at the interface between the first gate insulating layer 160 and the substrate 100. The formation of the silicon oxide layer may lead to a reduction in content of nitrogen atoms at the interface between the substrate 100 and the first gate insulating layer 160. In the case where the content of nitrogen atoms is reduced at the interface between the substrate 100 and the first gate insulating layer 160, it is possible to improve (reduce) deterioration in electron mobility.

After the thermal treatment in the oxygen atmosphere, a surface treatment may be performed on the first and second gate insulating layers 160 and 180. A mixed solution containing oxygenated water and ammonium hydroxide may be used in the surface treatment. The surface treatment may enable formation of a hydroxyl group (OH—), which may be eliminated by the thermal treatment, on surfaces of the first and second gate insulating layers 160 and 180.

Figure 12:
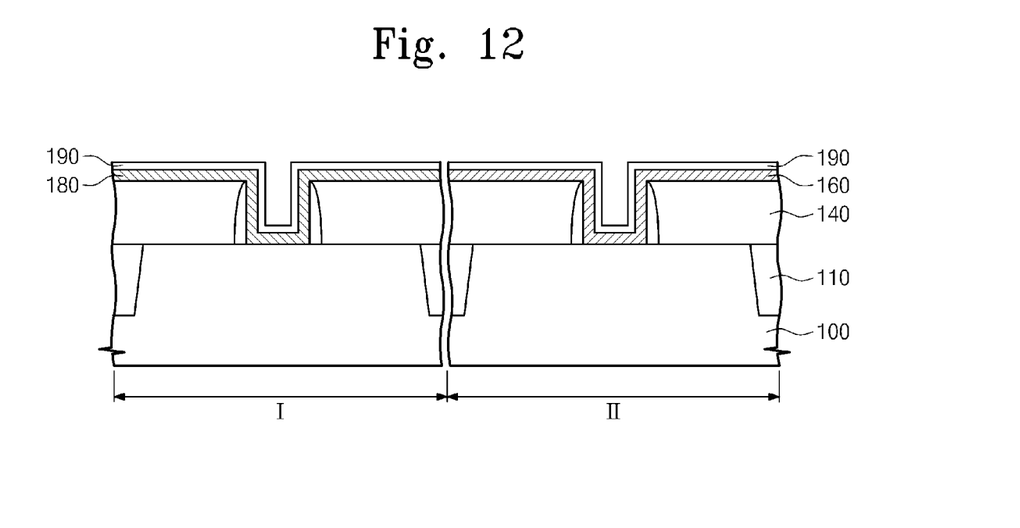

Referring to FIG. 12, a high-k dielectric 190 may be formed on the first and second gate insulating layers 160 and 180. For example, the high-k dielectric may include at least one composition selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. Moreover, "high-k," in this context can be understood to include compositions that have a dielectric constant higher than silicon dioxide and, in these embodiments, at least as high the dielectric constants of the compositions listed above.

The hydroxyl group (OH—) formed by the surface treatment may serve as a nucleation layer in the step of forming the high-k dielectric 190, and thus, may enable formation of the high-k dielectric 190 with excellent electric characteristics.

Figure 13:
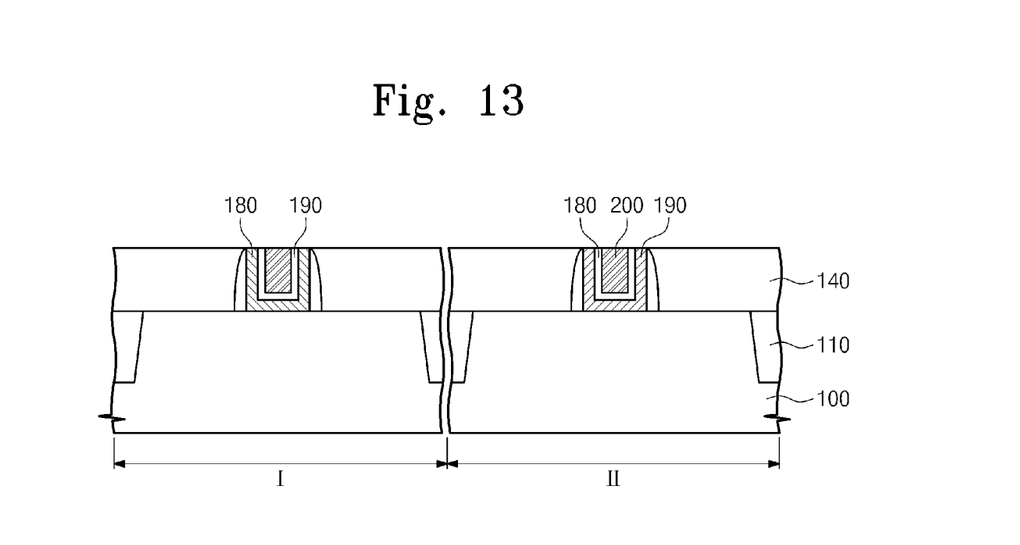

Referring to FIG. 13, a metal gate electrode 200 may be formed on the high-k dielectric 190. The formation of the metal gate electrode 200 may include forming a metal gate electrode layer (not shown) on the high-k dielectric 190, and then performing a planarization process to expose an upper portion of the interlayered insulating layer 140.

The metal gate electrode 200 may include at least one of titanium (Ti), titanium nitride (TiN), tantalum (Ta), tantalum nitride (TaN), tungsten (W), copper (Cu), aluminum (Al), or a mixture thereof. The planarization of the metal gate electrode layer may be performed by an etch-back process or by a chemical-mechanical-polishing (CMP) process.

According to example embodiments of the inventive concept, NMOS transistors may be formed with an improved time-dependent dielectric breakdown (TDDB) property, and PMOS transistors may be formed to have an improved negative bias temperature instability (NBTI) property. Accordingly, one can use the inventive concepts described herein to improve reliability of a semiconductor device with CMOS transistors.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming a first gate insulating layer on a substrate having a first region and a second region;
    performing a nitridation process on the first gate insulating layer;
    removing the first gate insulating layer from at least a portion of the first region to expose at least a portion of the substrate;
    forming a second gate insulating layer on at least the exposed portion of the first region of the substrate;
    thermally treating the first and second gate insulating layers in an oxygen atmosphere;
    forming a high-k dielectric on the first and second gate insulating layers; and
    forming a metal gate electrode on the high-k dielectric.

2. The method of claim 1, further comprising forming an interlayered insulating layer having a first trench and a second trench on the substrate, before forming the first gate insulating layer, and
    wherein forming the interlayered insulating layer comprises:
    forming a first dummy gate pattern on the first region of the substrate;
    forming a second dummy gate pattern on the second region of the substrate;
    forming the interlayered insulating layer to expose top surfaces of the first and second dummy gate patterns; and
    removing the first and second dummy gate patterns to expose the substrate.

3. The method of claim 2, further comprising fowling spacers on sidewalls of the first and second dummy gate patterns.

4. The method of claim 2, wherein the first and second gate insulating layers are formed on bottom surfaces of the first and second trenches, respectively.

5. The method of claim 1, wherein the first region is a PMOS region and the second region is an NMOS region.

6. The method of claim 5, wherein the first gate insulating layer has a thickness that is greater than that of the second gate insulating layer.

7. The method of claim 1, wherein forming the first gate insulating layer is achieved by at least one process selected from thermal oxidation, radical oxidation, rapid thermal oxidation, ultra-violet oxidation, oxidation using a solution containing oxygenated water and ammonium hydroxide, and ozone oxidation.

8. The method of claim 1, wherein the nitridation of the first gate insulating layer is achieved using at least one process selected from plasma nitridation and rapid thermal nitridation.

9. The method of claim 1, further comprising thermally treating the first gate insulating layer in an oxygen atmosphere after performing the nitridation process and before removing the first gate insulating layer from the first region.

10. The method of claim 1, wherein removing the first gate insulating layer from the first region is performed using hydrogen fluoride.

11. The method of claim 1, wherein forming the second gate insulating layer is achieved by at least one process selected from rapid thermal oxidation, ultra-violet oxidation, oxidation using a solution containing oxygenated water and ammonium hydroxide, and ozone oxidation.

12. The method of claim 1, wherein the thermal treatment of the first and second gate insulating layers in the oxygen atmosphere is performed by at least one process selected from rapid thermal annealing, spike-rapid thermal annealing, flash-rapid thermal annealing, and low-pressure annealing.

13. The method of claim 1, further comprising forming a hydroxyl group on the first and second gate insulating layers, before forming the high-k dielectric.

14. The method of claim 1, wherein the high-k dielectric comprises at least one composition selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

15. The method of claim 1, wherein the metal gate electrode comprises at least one composition selected from titanium (Ti), titanium nitride (TiN), tantalum (Ta), tantalum nitride (TaN), tungsten (W), copper (Cu), aluminum (Al), and mixtures thereof.

16. A method of fabricating a semiconductor device, comprising:
  injecting nitrogen into a first gate insulating layer on a substrate having a first region and a second region via a nitridation process;
  forming a second gate insulating layer on a portion of the first region of the substrate that is exposed and not covered by the first gate insulating layer;
  thermally treating the first and second gate insulating layers in an oxygen atmosphere, wherein the thermal treatment moves the nitrogen further away from an interface between the substrate and the first gate insulating layer;
  forming a high-k dielectric on the first and second gate insulating layers; and
  forming a metal gate electrode on the high-k dielectric.

* * * * *